United States Patent [19]

Anger

[11] Patent Number: 5,051,147

[45] Date of Patent: Sep. 24, 1991

[54] LAMINATOR FOR CUT-SHEET LAMINATION

[76] Inventor: Wolfgang Anger, Haus Schosskopf, A-6764 Lech/Arlberg, Austria

[21] Appl. No.: 370,409

[22] Filed: Jun. 22, 1989

[51] Int. Cl.⁵ ............................................. B30B 31/00
[52] U.S. Cl. ..................................... 156/355; 56/521; 56/522
[58] Field of Search ................. 83/321, 329, 330, 287, 83/288; 156/521, 522, 552, 353–355

[56] References Cited

U.S. PATENT DOCUMENTS

| 2,709,846 | 6/1955 | Saverin | 83/329 X |
|---|---|---|---|
| 4,004,962 | 1/1977 | Kleid | 156/522 X |
| 4,165,665 | 8/1979 | Shimizu | 83/287 |
| 4,350,065 | 9/1982 | Hayashi | 83/287 |
| 4,659,419 | 4/1987 | Miyake | 156/522 |
| 4,772,353 | 9/1988 | Weiss | 156/521 |

Primary Examiner—David Simmons
Attorney, Agent, or Firm—Allen A. Dicke, Jr.

[57] ABSTRACT

Described is a cut-sheet lamination using a laminator for the single or double-sided application of a film cut onto a printed circuit board using heated overlay rollers located opposite to each other in a housing. The printed circuit board and the cut film are fed to the overlay rollers simultaneously in the overlay region. The printed circuit board is led in with input rollers, and the film is pulled off a supply reel and is guided over input rollers to the printed circuit board. A cutting fixture is provided within the region of the input rollers. The cutting fixture cuts the film corresponding to the length of the printed circuit board in accordance with a sensor scan. The cutting fixture is put onto a lever capable of swivel motion. The cutting fixture travels along with the film at the cutting of the film, and the lead-in rollers for the film in the region where the cutting occurs are constructed as suction rollers. This provides continuous through movement of the printed circuit boards through the overlay rollers which reliably avoids damage to the photo-materials there.

14 Claims, 4 Drawing Sheets

LAMINATOR FOR CUT-SHEET LAMINATION

FIELD OF THE INVENTION

The invention concerns a laminator for applying cut film to either one side or to both sides of a printed circuit board.

BACKGROUND OF THE INVENTION

Laminator equipment is used to apply to one or both sides of a printed circuit board a resistive layer using a dry process. For the same purpose, wet photoresist material is applied. The circuit board consists of polyester material as carrier. The attached photoresist layer is generally designated here as film. The film has a protective layer and is stored on a supply reel, and after the protective layer is pulled off, the film features a sticky underside. After cutting of the film with a cutting fixture, the film is pressed onto (laminated) the printed circuit board in the presence of pressure and heat using heated laminating rollers.

It is particularly important that the cut overlay for the printed circuit board be accurately and cleanly cut and applied, and especially that the film overlay be cut slightly shorter than the printed circuit board. By this method, otherwise considerable consumption of material is saved and a protruding sticky rim of cut film on the printed circuit board is avoided.

In the course of further work with a board having a rim of this kind, following boards may stick together or the border of the film layer may crumble off. Because of the sticky nature of the debris, it is to be expected that operational interruptions may occur with this type of machinery. Because these debris particles are very sticky, it must be expected that they will reach the boards, disturb the subsequent photo-illumination process, and damage the conductor trace paths. Consequently, the film is always cut shorter than the plate. This also results in financial saving of expensive film.

A laminator for cut-sheet lamination of the described kind is already known, especially with cutting the film shorter than the printed circuit board. In that device for laminating, the film is positioned at the front edge of the printed circuit board, and both are led through the overlay rollers together with the printed circuit boards using swiveling feed rollers which guide the film in and stretch the film using positioning devices.

In that laminating device, the cutting device moves against the direction of the film transport upwards and cuts the film somewhat shorter than the printed circuit board. A disadvantage is that a relatively complicated construction with many failure-prone parts is needed resulting also in high fabrication costs. A further disadvantage of that version is that transport of the film and movement of the printed circuit board are stopped as the film is cut from the plate which results in the disadvantage that, with heated overlay rollers, the rollers come to rest against the printed circuit boards which have film already applied, resulting in local overheating of the film in the region of the overlay rollers.

SUMMARY OF THE INVENTION

In order to aid in the understanding of this invention, it can be stated in essentially summary form that it is directed to a laminator which has suction rollers provided for the transport of the film, which starts with the reversing roller at the film supply reel, and for guiding the film to the printed circuit board in the region of the overlay rollers between which the cutting fixture is guided back and forth. The film transport is simplified and performed with precision, especially with different film materials. This secure film guiding is retained even if the film is cut while moving between suction rollers. The beginning of the film is positioned into a starting position to ensure that, when a new printed circuit board is fed in, the film is redirected to the beginning of the printed circuit board. The cut-off, free end of the film is easily grasped by the following suction roller after cutting of the film, and the film is put into an initial position in the region of the printed circuit board.

It is, therefore, a purpose and advantage of this invention to provide a laminator such that, with few and simple means, good operational integrity at small fabrication cost can be obtained and the printed circuit boards are capable of running through the overlay rollers continuously without being damaged.

It is another purpose and advantage of this invention to provide a cutting device which moves along with the film in its transport direction, depending on the values of the sensor signals which correspond to the length of the printed circuit board, as soon as, depending upon the length of the printed circuit board, the film length to be cut is established.

It is another purpose and advantage of this invention to provide a high-speed laminator wherein the transport speed of the film is approximately between 0.25 and 2.5 meter/minute. With a cutting duration of the cutting fixture of approximately 1 second, the film can be cut without difficultly while it is moving, especially when preselecting a shorter length than the corresponding length of the printed circuit board.

The laminator avoids requiring positioning fixtures, such as fixtures going back and forth; and the laminator operates with the printed circuit boards running through the overlay rollers continuously, while the film is fed intermittently but is cut continuously during the film transport. High operational integrity and exact film guiding are obtained at low fabrication cost with few and simple means. In the preferred version, the lever of the cutting fixture is on its front side implemented as a cog rail, which is engaged to a motor-driven pinion wheel. The cutting fixture is mounted on a carriage having a motor and another driven pinion wheel which is engaged with a cog rail that is perpendicular to the film. A pneumatic drive for the running carriage may be used instead of the motor.

It is advantageous if the cutting fixture has single motor or pneumatically driven oscillating knives which rest under spring tension against a cutting edge, with the film being guided on top of the cutting edge. In the preferred version, within the region of the run-along path of the cutting fixture, there is a first suction roller on top and a second suction roller below with sheet metal guides in the region of guiding the film at the second suction roller. In an advantageous version, the first suction roller is preceded by a reversal roller for the film, and the suction region of the first and second suction rollers is made adjustable according to the angles by moving the suction rollers and/or the reversal roller and the sheet metal guides.

In a preferred implementation example, in the area of film guiding, the suction rollers, the reversal rollers, or in the area of the roller pairs, a rotational pulse emitter is located. The pulse emitter in connection with a pulse selector switch puts out pulses from the sensors according to the length of the printed circuit board. Thereafter, emission of the pulses and the drive of the cutting fixture is started, and a motor and electromagnetic clutch and the pinion wheel for initiating the swivel motion of the cutting fixture is started synchronized to the transport speed of the film.

The invention is further described using drawings which depict only one possible implementation of the invention.

In the following, the invention is further described using drawings which depict only one possible implementation of the invention. With this, further features and advantages of the invention which are essential to the invention, emerge.

DESCRIPTION OF THE PREFERRED EMBODIMENTS

Figure 1:
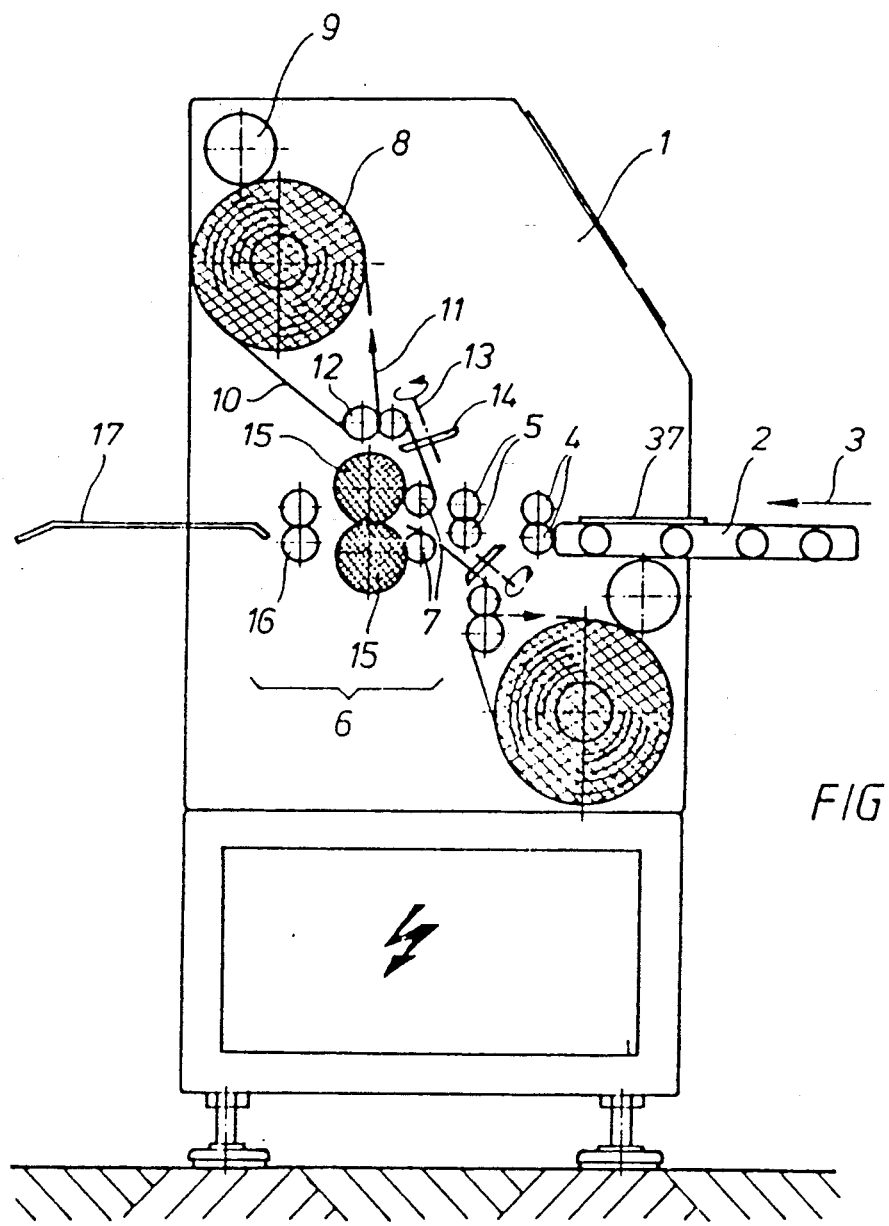
FIG. 1 is a schematic side view illustration of the sequence of functions with the laminator of this invention.
Figure 2:
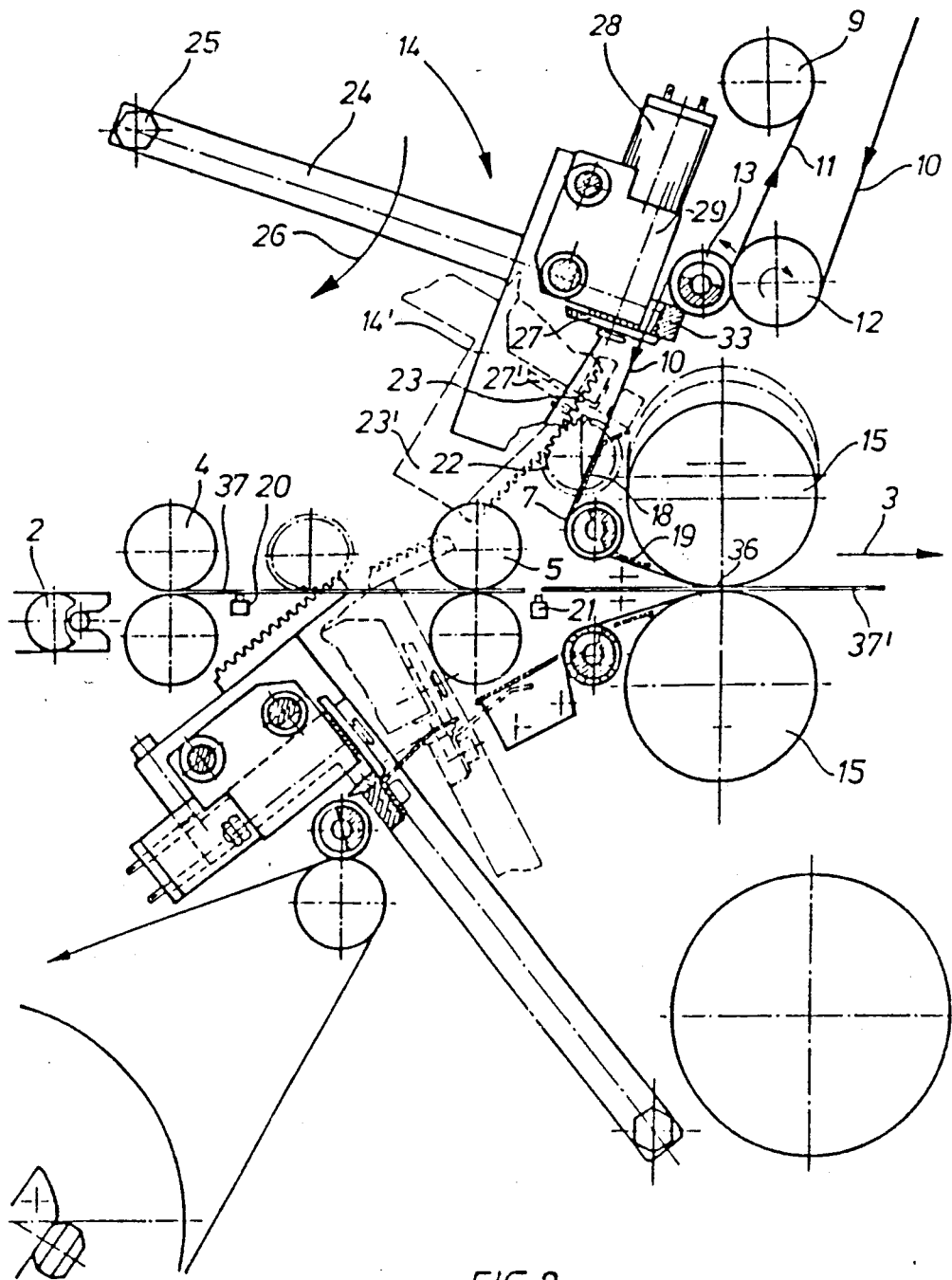
FIG. 2 is an enlarged view of a portion of the laminator of FIG. 1 showing in detail the move-along cutting fixture in the region of the suction rollers.

The laminator shown in FIG. 1 consists of a housing 1 which contains a feed-in device 2 to transport the printed circuit board 37 in the direction of the arrow 3 into the housing 1, according to FIG. 1 and as seen in FIG. 2 from the opposite side. The printed circuit board 37 first reaches the roller gap of a first roller pair 4 to obtain guiding of the plate 37. Afterwards, the not-yet overlayed printed circuit board or plate 37 arrives at the roller gap of a second roller pair 5, with the drive of the first roller pair 4 being dependent on the drive of the second roller pair 5 such that it is always provided that the plates 37 are led into the overlay region 6 with an accurately defined distance or gap, depending on the plate length despite the fact that initially the printed circuit boards 37 are fed in laying in a stack.

At the inputting of the plate 37, it is grasped by the first pull-in roller pair 4 and transported somewhat slower than with the following second roller pair 5. As the board 37 is then gripped by the roller pair 5, the first roller pair 4 runs faster (free run) until the end of the board is reached. As plate 37 leaves the first roller pair 4, this roller pair 4 turns back by the amount of the speed differential and turns slower establishing thereby the necessary distance (gap) from the preceding plate 37. The plates are placed stack-on-stack onto the input device 2 where, however, to differentiate between the individual plate dimensions, the two input roller pairs 4, 5 do not turn synchronously. The first roller pair 4 is equipped with coasting and a backspace element. By this, a defined gap between the entered plates is established independent of the length of the printed circuit plates.

Board 37 arrives after further input travel through the second roller pair 5 in the region of a top-mounted suction roller 7, which serves for leading in of the film 10. Board 37 is then pushed or pulled into the overlay region 6 by the overlay rollers 15 where the film 10 has come from above into the contacting area 36 to rest with its sticky surface at the beginning area of board 37. With further pulling in of board 37 together with the applied film 10 into the press-on region of the overlay rollers 15, the film 10 is then laminated onto the board 37 by heat and pressure. Depending upon the length of board 37, as determined prior within the input region between roller pairs 4 and 5 using sensors 20, 21, cutting of the film 10 is accomplished within the region between suction rollers 7 and 13 using a cutting fixture 14, which moves along with the film 10.

A rotation measuring device within the region of the film input counts pulses according to plate length. After the count is completed, or preferably somewhat earlier as determined by a preselect switch, the pinion wheel 22 at the cog rail 23 is started over a run-along clutch, which makes the cutting fixture 14 move along with the film 10. At the same time, drive 28 of the cutting knife 27 is started. After completion of starting of drive 28, the film is cut prior to reaching suction roller 7. After the cut is completed, the cutting fixture traverses back into the rest position.

The sensors 20, 21 consist of a fiber-optical recognition system where the beginning or end of a printed circuit board 37 is recognized using two separate dual sense heads. In connection with scanning of the printed circuit board, a rotation measuring pulse emitter with, for example, 1,000 pulses/revolution is provided in the region of the film input or at the pull-in roller pair, which makes a resolution of less than 0.1 millimeter possible. At the exit of the overlay rollers 15, the printed circuit board 37 is then transferred out by the pull-out roller pair 16, where additional cold laminating pressure is preformed to the output table 17. Considering synchronization of plate input and film feed, first the printed circuit board 37 is pulled in by roller pairs 4 and 5, where the beginning of printed circuit board 37 passes the sight gate to signal the front edge of the board at sensor 21 immediately behind the roller pair 5, which gives the signal to the rotational pulse emitter to count off a certain number (A) of pulses for moving (within the region of the suction rollers 7, 13) prior cut-off, free end of the film 10 from a reference position to the contact region 36. The printed circuit board and the film are then grasped by the overlay rollers 15 within the contact area 36 and pulled in. The plate end passes light gate 20. With this, the pulse counter is started. After a number of pulses (B) corresponding to the preselected counter setting is run off, the cutting fixture 14 is started and cuts the film while it is in motion.

As the cutting process is executed, again a constant number of pulses (C) is put to work, which brings the film into an always constant initial position closely behind the suction roller 7. The pulse count (A) of the film advance after the front edge of the printed circuit board has passed the sensor 21 influences the distance from the board edge of the edge of the film, which will be applied. The pulse number (A) can be preselected by a decade switch (e.g., for 1 to 10 millimeter distance from edge of film to edge of board plate). After the pulse count is reached, the suction rollers 7, 13 are engaged and transport the film 10 in the direction to the circuit board 37 synchronously with the motion of the circuit board 37 to the contact region 36, where film and circuitboard are grasped by the overlay rollers 15. The film 10 is thereby correctly positioned at one or both sides to be cemented by the overlay rollers 15. The overlay rollers may be heated or may be cold. The pressure of the rollers is pneumatic, and the pressure as well as the roller gap is continuously adjustable. As the end of the printed circuit board 37 reaches the light gate of the sensor 20 after the first pull-in roller pair, a pulse count (B), which may also be preselected, is put to work analogous to the start process. After reaching the pulse count, a further clutch (not shown here) is activated, which is provided for the synchronous transport of the whole cutting fixture 14 in parallel to the film in its lengthwise direction. At the same moment, drive 28 located on the cutting fixture is started, with the drive requiring less than a second for cutting the film 10 in the perpendicular direction to itself.

Figure 3A:
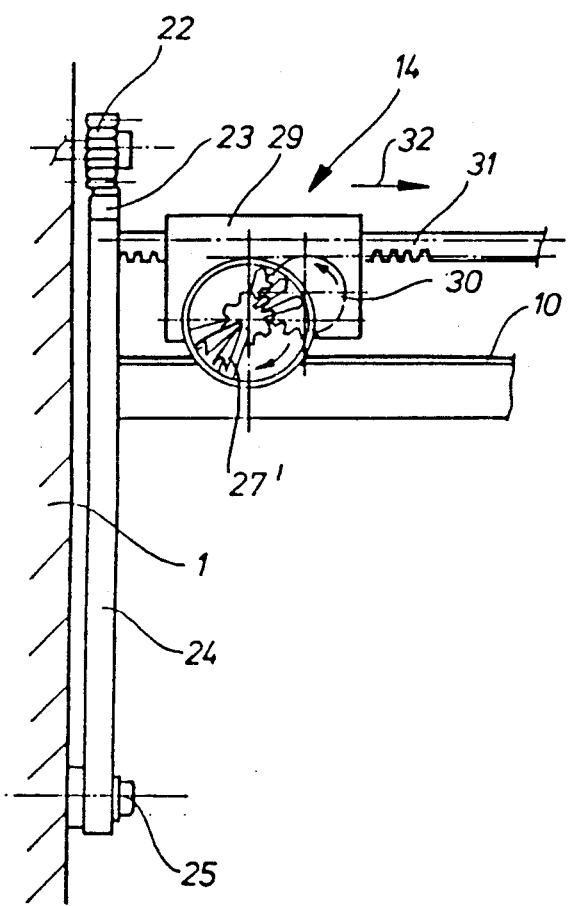
FIG. 3a is a view of the cutting fixture of FIG. 3 with the direction of view toward the perpendicular side of film to be cut.

After cutting of the film with the cutting knife 26 by moving a sled 29, as shown in FIG. 3a, and after the cutting knife 27 has reached the other side of the film, within 15 milliseconds the whole cutting fixture 14 is clutched out again and pivoted back to its initial position. The suction rollers 7, 13 move the film on until a preselected pulse count (C) that was started with the cutting process is reached. This pulse count (c) corresponds to the distance between the cutting edge and suction roller 7 in front of the overlay rollers 15 (initial position of the film). With pull-in of an additional printed circuit board 37, the film 10 is pushed, started by the signal from sensor 21, from its initial position moving synchronously with the printed circuit board 37 as far as the contact region 36. The single or both-sided overlayed board 37 is removed from the machinery by the following pull-out roller pair 16 and over a run-out table 17. With this system, continuous laminating of board 37 independent of its length dimension is possible; i.e., the board 37 run without stopping through the overlay rollers 15.

Film guiding in connection with the cutting process considering the construction aspects of the run-along cutting fixture is further described as follows. First, it is pointed out that the overlay process for the printed circuit board with a film from the top side or the bottom side of the board 37 are identical. Therefore, for reasons of simplicity, only the film input from above with the cutting device 14 and the laminating are described further. The film input from above consists of FIG. 1 of the supply reel 8 in the vicinity of which a pull-off roller 9 is located, as shown in FIGS. 1 and 2. This pull-off roller 9 winds up the protective film 11, which is pulled off of the film 10 within the region of the reversal roller 12. The uncovered film 10 reaches with its sticky underside, which is on the other side of suction roller 13, via suction roller 13 the region of cutting fixture 14 and moves thereover a support plate 33 of the cutting fixture and continues on into the area of suction roller 7. The film is, therefore, held firm in the vicinity of reversal roller 12 by suction rollers 7 and 13. The reversal roller 12 is implemented as a rubber roller, while rollers 7, 13 have suction construction. Responding to the pulse controlled drive between the reversal roller 12 and the rollers 7, 13, the film is herewith led to the board 37 at the contact region 36 in an intermittent manner, while the boards 37 and the accompanying film run through the overlay region 6 in a continuous manner. The cutting fixture 14 which follows the motion of the film in the transport direction, its function being described hereinafter, is located between the suction rollers 7 and 13.

Figure 3:
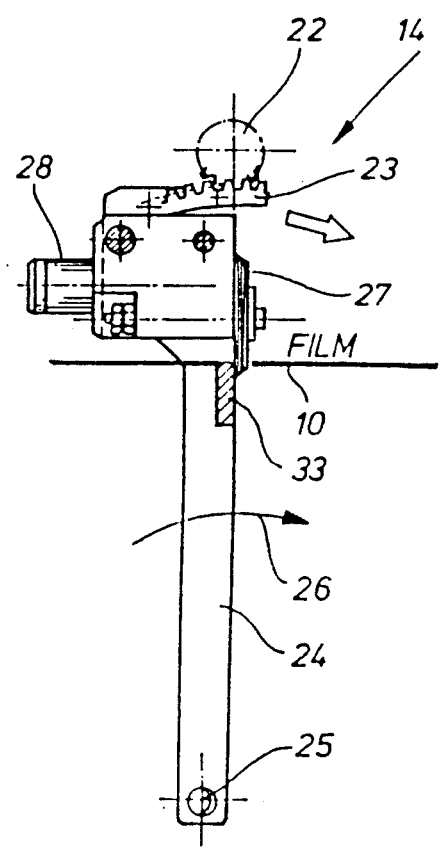
FIG. 3 is an enlarged detail of the cutting fixture of FIG. 2 with the direction of view toward the length side of the film.

According to FIGS. 2, 3 and 3a, the whole cutting fixture 14 is arranged in an angular region between suction rollers 7, 13 such that it can swivel in pivot direction 26. Cutting fixture 14 moves along with the film 10 whenever, at the completion of pulse count (B), the film has to be cut. There is a preselector switch provided to limit the pulse count (B) to enable cutting the film shorter than the length of the plate. With another preselect switch, the pulse count (A) can also be limited. After the sensor 20, 21 recognizes the beginning or the end of a printed circuit board 37, a pulse count (A) or (B), which can be adjusted using separate preselect switches, is put to work. The length of the pulse counts (A or B) can be chosen arbitrarily using a freely programmable controller. A pulse emitter, in connection with a preselector switch, is provided within the film-guiding region; e.g., at the suction rollers 7 or 13, which, after reaching a predetermined pulse count, starts pinion wheel 22 and drive 28 causing the film 10 to be cut by the cutting fixture 14 after a short run. After this, the cutting fixture 14 swivels back within a short time period.

Accordingly, in connection with a preselect switch, the drive 28 of the rotating knife 27 is eventually started. After the start of pinion wheel 22, the cutting fixture 14 pivots in the traversing direction 26, and the film 10 is cut while in motion between suction rollers 7 and 13. As it is advantageous here, the pull-in motion of the printed circuit boards 37 together with the film 10 moving along is not interrupted in the region of the overlay rollers 15, so that overheating of the film 10 on single points of the printed circuit board 37, which may influence the consecutive treatment procedure of the photo-overlayed printed circuit board unfavorably, is avoided. The total cutting fixture 14 is herewith located on the free end of arm 24, which is fastened capable of swiveling to housing 1 at the pivot point 25. The swivel motion of the arm 24 is caused by the fact that there is a cog rail 23 firmly attached to the lower end of the cutting fixture 14, which engages to a correspondingly rotating pinion wheel which is driven and has a fixed location in the housing. The drive and the cog rail are constructed in such a way that, at the pressure support plate 33, a speed synchronous to the film is obtained. Pinion wheel 22 is started over an electromagnetic clutch by a motor (not shown) and also pivots the cog rail 23 into cog rail position 23'. The cutting fixture 14 is started simultaneously with the start of pivoting motion in traversing direction 26.

The cutting process is, according to FIG. 3a, initiated by shifting the sled 29 with the cutting knives 27' simultaneously with the start of drive motor 28 for the cutting knives 27. During the time pinion wheel 22 moves cog rail 23 with the cutting fixture 14, as shown in FIGS. 2 and 3, sled 29 leads the cutting knife 27' across the film 10 to cut it, as shown in FIG. 3a. According to FIG. 3a, a second cog rail 31 is provided which is engaged to a pinion wheel on motor 30 to move the sled 29, including the drive 28 with the rotating knives 27, perpendicularly across film 10 in the direction of arrow 32. The cutting knives 27 rest here spring-loaded against a support plate 33. Because of the choice of using rotating cutting knives 27, excellent cutting quality is achieved.

Figure 4:
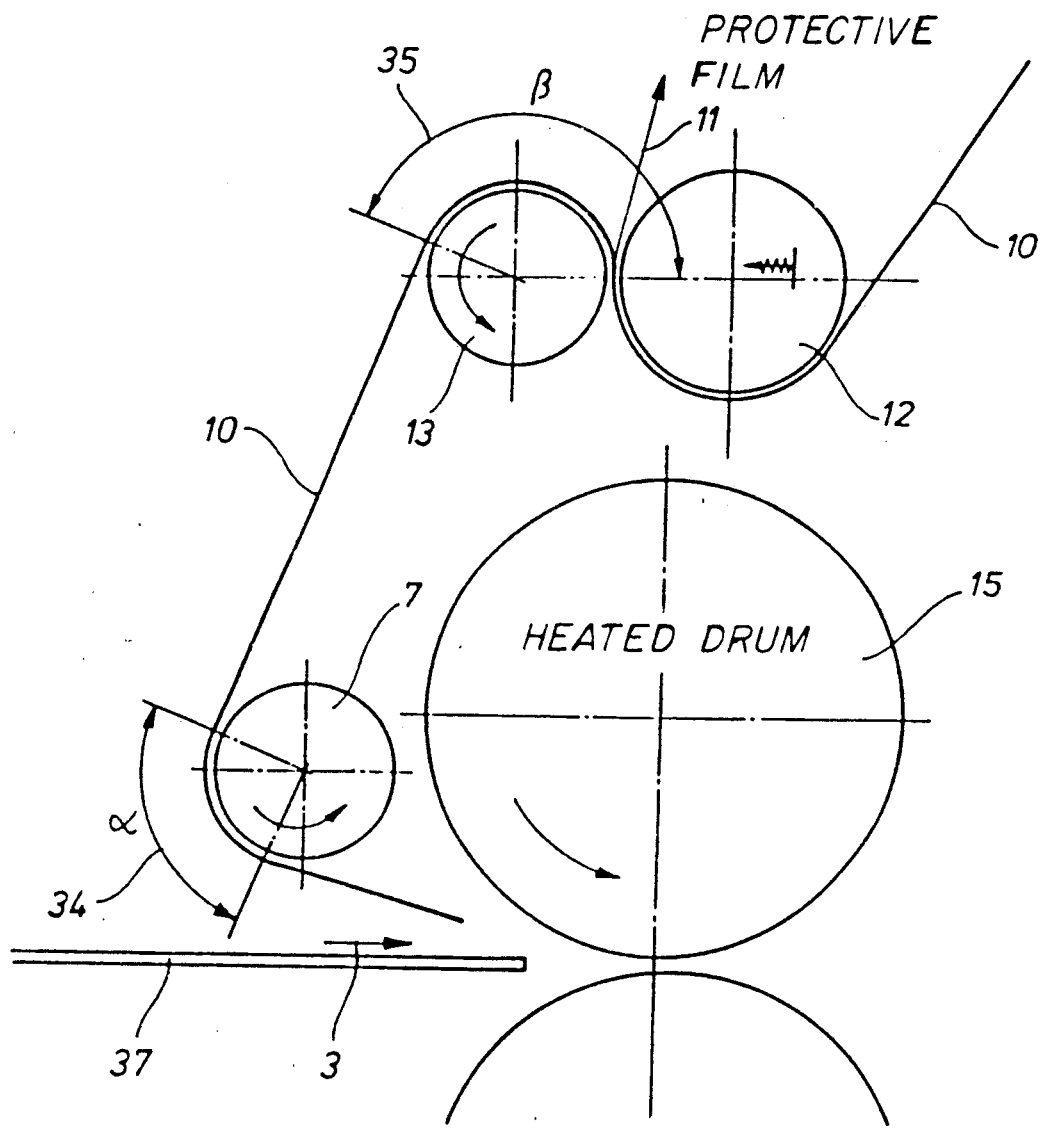
FIG. 4 is a view of the feed-in in the region of the suction rollers in detail.

Because of the intermittent feed-in of the film, it is now possible to assign film cuts of different lengths to the respective printed circuit board 37 of the right size. Depending upon the adjustment of the equipment, the film cuts may be shorter than the printed circuit boards, which brings about the advantages described hereinabove. The film cuts, however, may also be the same length as the printed circuit boards. Furthermore, according to FIG. 2, sheet metal guides 18, 19 are provided for feeding the film from the initial position appropriately to the overlay gap at the overlay rollers 15. FIG. 4 shows schematically the drive of the film 10 in the region of the suction rollers 7, 13. Here, it can be recognized that the upper suction roller 13 holds the film 10 within a region of angle 35, while lower suction roller 7 contacts the film 10 in a substantially smaller angular range 34. By the intermittent drive of these two suction rollers 7, 13, the film is advanced in an exact manner and is held extremely well, especially during cutting, and it cannot free itself accidentally from these suction rollers thereby making it possible to apply the film with the highest accuracy to the printed circuit board 37. The choice of both angles 34, 35 are dependent on the weight of the film, the strength of the film, and the transport speed. The range and the position of angles 34, 35 is adjustable specifically by changing the position of the suction rollers 7, 13 also possible in connection with a shift in the location of the reversal roller 12. Furthermore, the guiding range of the sheet metal guides 18, 19 can also be changed and additional drums and reversal rollers may be installed within the region of the film-guiding range for changing the angular range of the angles 34, 35.

In summary, there is, therefore, a cut-sheet lamination with continuous operation of the boards 37 to be overlayed, which can be entered stack-on-stack into the input device 2. Boards of different lengths with an arbitrary mix can be entered in any sequence. The film is cut shorter than the boards, and the difference can be preset. There is a lamination-free space at the beginning-/end of the printed circuit board that can be preselected independent from the length of the plates. Through rotation-segment-suction according to the invention, the film is brought into position free of tension over the suction rollers 7, 13, which makes it possible to achieve exact guiding and cutting of the film by simple means. The rotation-segment-suction according to the invention permits a very simple construction, because back-and-forth moving components are not used. The film is uniformly driven and can be synchronized very easily using an electromagnetic clutch where switching durations of less than 15 milliseconds can be achieved. By this means, the use of expensive servo or stepper motors is not necessary. For the total drive, a DC-motor with toothed belt drive is provided. With the construction of the laminator according to the invention, a wear and tear resistant total solution has been provided which has the advantage of long equipment life without further adjustment work.

The subject of the present invention is not only the subject of each individual claim alone, but also the combination of the individual patent claims in relation to each other. All the data and features disclosed in the write-up, including the summary and especially the spatial layouts shown in the drawings, are claimed to be important parts of the invention as far as they are new in themselves or in combination relative to the status of technology.

What is claimed is:

1. A laminator for applying cut film to at lest one side of a printed circuit board comprising:
   a housing;
   first and second laminating rollers mounted opposite to each other in said housing;
   means for feeding a series of printed circuit boards to said heated laminating rollers, said means for feeding a series of printed circuit boards comprising first and second pairs of board feed rollers with said first pair advancing the successive boards at a first speed and said second pair of board feed rollers advancing the successive boards at a successive and higher speed to feed the successive printed circuit boards spaced from each other at the second speed with uniform spacing between successive boards;
   first and second film rollers, said first and second film rollers being vacuum rollers to hold film thereagainst for film advance, means to drive both said film rollers at the same speed to prevent film tension therebetween, said second film vacuum roller being positioned to feed film to a printed circuit board adjacent said laminating rollers;
   a cutting device located between said film vacuum rollers, said cutting device being mounted to move with the film in the direction of film motion while the film is cut, said cutting device being for cutting the film in accordance with a signal corresponding to the length of the printed circuit board; and
   means for sensing the length of the printed circuit board being fed to said laminating rollers.

2. The laminator of claim 1 wherein said cutting means includes a pivoted lever which swings with the film advanced and a cutter mounted on a sled to move across the path of the film to cut the film, said carriage motion being coordinated with lever motion so that the cut of said cutting means is in a direction perpendicular to the film length.

3. The laminator of claim 1 wherein said cutting means comprises a rotating knife which resiliently rests against a straight cutting edge.

4. The laminator of claim 1 wherein a guide roller is positioned along the path of said film adjacent said first vacuum roller and wherein the suction region of said first and second vacuum rollers is controlled to direct the cut edge of the film.

5. The laminator of claim 1 further including a pulse generator connected to produce pulses in proportion to the rate of feed of a printed circuit board and sensors adjacent the path of motion of the printed circuit board for sensing the front edge and back edge of a printed circuit board moving along the path.

6. The laminator of claim 5 further including control means interconnecting said sensors for initiating cutting upon completion of a pulse sequence.

7. The laminator of claim 6 wherein said cutting means is mechanically moved in the direction of film movement and mechanical movement is initiated as a function of pulse counting.

8. A laminator for applying cut film to at least one side of a printed circuit board comprising:
   a housing;
   first and second laminating rollers mounted opposite to each other in said housing;
   means for feeding a series of printed circuit boards to said heated laminating rollers, said means for feeding a series of printed circuit boards comprising first and second pairs of board feed rollers with said first pair advancing the successive boards at a first speed and aid second pair of board feed rollers advancing the successive boards at a successive and higher speed to feed the successive printed circuit boards spaced from each other at the second speed with uniform spacing between successive boards;

first and second film rollers, said first and second film rollers being vacuum rollers to hold film thereagainst for film advance;

drive means connected to both said first and second film rollers for driving both said first and second film rollers at the same speed and at the same time to prevent film tension therebetween, said second film roller being positioned to feed film to a printed circuit board adjacent said laminating rollers;

a cutting device located between said film vacuum rollers, said cutting device being mounted to move with the film in the direction of film motion while the film is cut, said cutting device being for cutting the film in accordance with a signal corresponding to the length of the printed circuit board; and means for sensing the position and length of the printed circuit board being fed to said laminating rollers, said means for sensing being connected to said intermittent drive means for driving both said film rollers and connected to said cutting device for cutting film between said film rollers.

9. The laminator of claim 8 wherein said cutting means includes a pivoted lever which swings with the film advanced and a cutter mounted on a sled to move across the path of the film to cut the film, said carriage motion being coordinated with lever motion so that the cut of said cutting means is in a direction perpendicular to the film length.

10. The laminator of claim 9 wherein said cutting means comprises a rotating knife which resiliently rests against a straight cutting edge.

11. The laminator of claim 10 wherein a guide roller is positioned along the path of said film adjacent said first suction roller and wherein the suction region of said first and second suction rollers is controlled to direct the cut edge of the film.

12. The laminator of claim 8 further including a pulse generator connected to produce pulses in proportion to the rate of feed of a printed circuit board and sensors adjacent the path of motion of the printed circuit board for sensing the front edge and back edge of a printed circuit board moving along the path.

13. The laminator of claim 12 further including control means interconnecting said sensors for initiating cutting upon completion of a pulse sequence.

14. The laminator of claim 13 wherein said cutting means is mechanically moved in the direction of film movement and mechanical movement is initiated as a function of pulse counting.

* * * * *